United States Patent [19]

Haji

[11] Patent Number: 5,653,380
[45] Date of Patent: Aug. 5, 1997

[54] WIRE BONDING APPARATUS AND WIRE BONDING METHOD

[75] Inventor: Hiroshi Haji, Chikushino, Japan

[73] Assignee: Matsushita Electric Industrial Co., Ltd., Osaka, Japan

[21] Appl. No.: 539,376

[22] Filed: Oct. 5, 1995

[30] Foreign Application Priority Data

Oct. 6, 1994 [JP] Japan .................................. 6-242783

[51] Int. Cl.[6] .................................................. H01L 21/60
[52] U.S. Cl. .................................. 228/180.5; 228/4.5
[58] Field of Search .......................... 228/102, 180.5, 228/4.5, 9, 904

[56] References Cited

U.S. PATENT DOCUMENTS 4,069,961  1/1978  Nicklaus et al. ......................... 228/4.5
4,928,871  5/1990  Farassat ................................. 228/4.5
4,998,002  3/1991  Okikawa et al. ........................ 228/4.5

*Primary Examiner*—Samuel M. Heinrich
*Attorney, Agent, or Firm*—Pollock, Vande Sande & Priddy

[57] ABSTRACT

An electrode of a chip and an electrode of a substrate are connected by a wire drawn out from a lower end of a capillary tool. When the wire accidentally gets into the capillary tool and thus is not drawn out from the lower end of the capillary tool, a suction unit is operated to automatically draw out the wire from within the capillary tool using a suction force. A cutter is provided in the suction unit for cutting the sucked wire such that the wire of a given length remains to be drawn out from the lower end of the capillary tool.

7 Claims, 6 Drawing Sheets

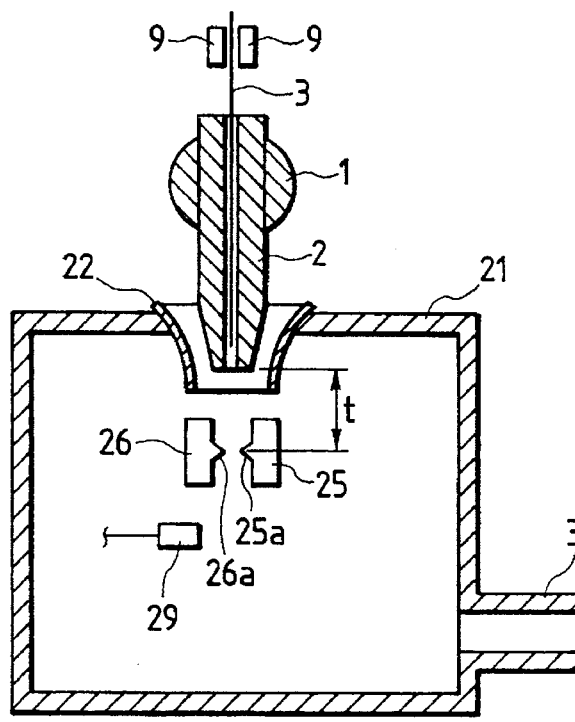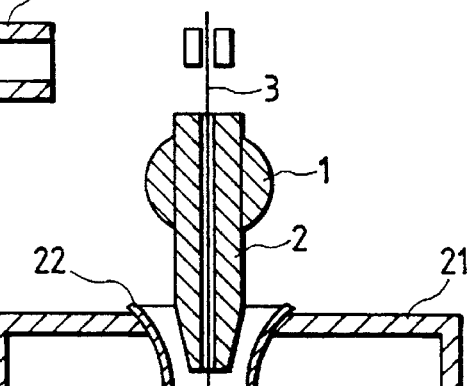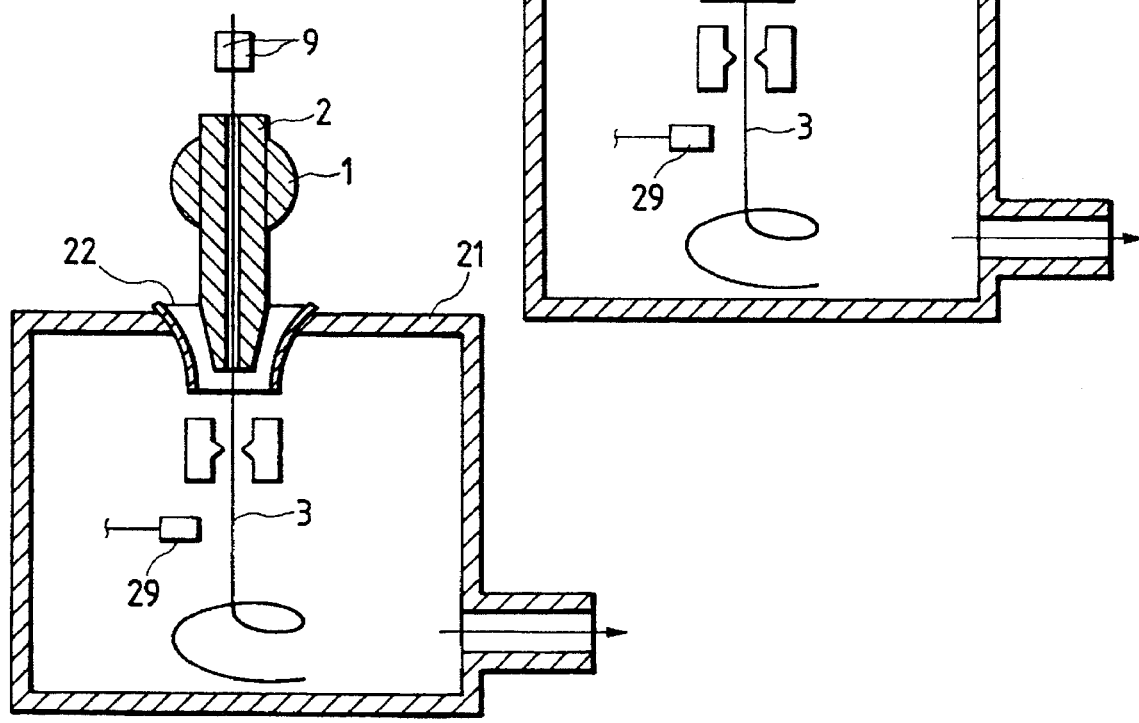

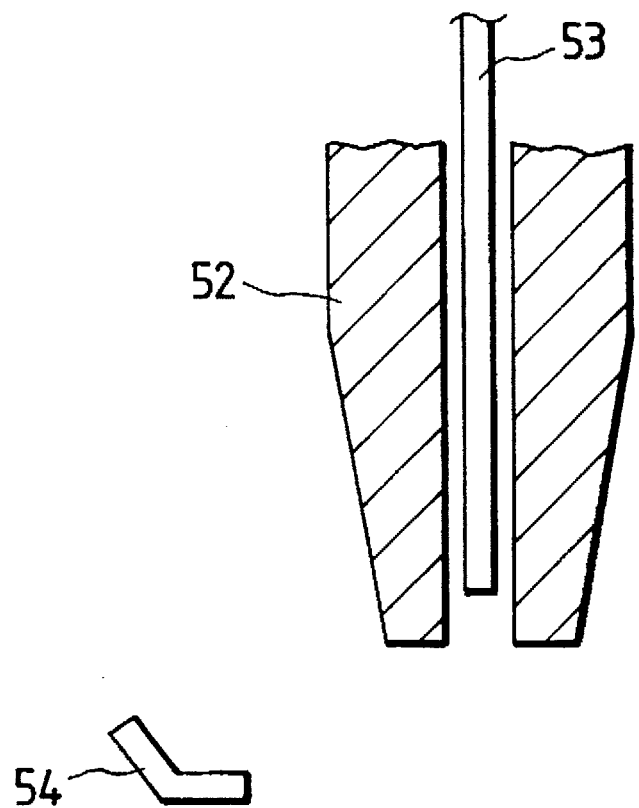

WIRE BONDING APPARATUS AND WIRE BONDING METHOD

BACKGROUND OF THE INVENTION

1. Field of the Invention

The present invention relates to a wire bonding apparatus for and a wire bonding method of connecting an electrode of a chip and an electrode of a substrate by a wire.

2. Description of the Prior Art

In the process of fabricating electronic parts, an electrode of a chip and an electrode of a substrate are connected to each other by a wire. Hereinbelow, the conventional wire bonding will be explained.

FIGS. 9A, 9B, 9C and 9D are side views each showing a main portion of a conventional wire bonding apparatus in operation, wherein these figures show states of the wire bonding apparatus in order of operations. First, in FIG. 9A, numeral 51 denotes a bonding arm, numeral 52 a capillary tool held at a tip portion of the bonding arm 51, and numeral 53 denotes a wire inserted through the capillary tool 52. The wire 53 is drawn out downward from a lower end of the capillary tool 52. This drawn-out portion is, in general, called a tail and represented by symbol 53a.

As shown in FIG. 9A, a torch (electrode) 54 is moved close to a lower end of the tail 53a. Subsequently, a high voltage is applied to the torch 54 to generate an electric spark between the torch 54 and the lower end of the tail 53a so that a ball 55 is formed at the lower end of the tail 53a. Thereafter, as shown in FIG. 9B, the capillary tool 52 is moved to a position just above an electrode (not shown) of a chip 56 and then lowered by pivoting the bonding arm 51. Accordingly, the ball 55 is pressed onto the electrode of the chip 56 by means of a lower end surface of the capillary tool 52 so as to be bonded thereto. Numeral 57 denotes a substrate on which the chip 56 is mounted. Numeral 58 denotes a support section for supporting the substrate 57. The substrate 57 is, in general in the form of a printed board or a lead frame.

Subsequently, as shown in FIG. 9C, the capillary tool 52 is moved to a position just above an electrode (not shown) of the substrate 57 and then lowered so that the wire 53 drawn out from its lower end is pressed onto the electrode of the substrate 57 so as to be bonded thereto. Thereafter, as shown in FIG. 9D, the capillary tool 52 is raised. When the capillary tool 52 is moved upward by a distance corresponding to the tail 53a, the wire 53 is clamped or held by a clamper 59 and then raised upward along with the capillary tool 52. As a result, the wire 53 is cut at a bonding point A on the substrate 57 so that the wire 53 drawn out from the lower end of the capillary tool 52 becomes a new tail 53a. Then, the process returns to the state shown in FIG. 9A and the foregoing bonding operations are repeated.

In the foregoing wire bonding, the process of forming the ball 55 at the lower end of the tail 53a by the electric spark is important. However, in the conventional wire bonding apparatus, failure in drawing out the tail 53a is liable to occur as described hereinbelow so that the ball 55 can not be formed frequently. Specifically, as described above and shown in FIG. 9C, the wire 53 is pressed onto the electrode of the substrate 57 by the lower end surface of the capillary tool 52 so as to be bonded thereto. However, at this instant, the wire 53 is liable to be cut due to the edge at the lower end of the capillary tool 52. Thus, even when the capillary tool 52 is raised for forming the tail 53a, the wire 53 is cut easily in an instant. Accordingly, in the worst case, as shown in FIG. 9D, a lower end portion of the wire 53, which should otherwise be the tail 53a, gets into the capillary tool 52 so that no tail is resulted.

FIG. 10 is a partial sectional view of the capillary tool 52 with no tail drawn out, which is caused in the conventional wire bonding apparatus. As shown in the figure, since the lower end of the wire 53 is received inside the capillary tool 52, even if the torch 54 is moved closer and applied with a high voltage, no spark is generated between the torch 54 and the lower end of the wire 53 so that the ball 55 is not formed. In this case, the bonding of the ball 55 onto the electrode of the chip 56 as shown in FIG. 9B can not be achieved.

Occurrence of no spark even upon application of the high voltage to the torch 54 is detected by known electric detection means and notified to an operator by a signaling element, such as a buzzer. On this occasion, the operator draws out the wire 53 from the inside of the capillary tool 52 using a pincette to provide the tail 53a, and then restarts the wire bonding operations.

However, a diameter of the capillary tool 52 is, in general, about 2 mm which is very small, and further, the wire 53 having a diameter of about 20 μm, which is extra fine, is inserted through the inside of the capillary tool 52. Accordingly, it is quite troublesome to draw out the wire 53 from the inside of the capillary tool 52 using the pincette, which imposes much labor upon the operator. Further, as described above, failure in drawing out the tail 53a occurs with high frequency so that the operator is frequently required to stop the operation of the wire bonding apparatus and perform the wire drawing-out operations. Failure in formation of the ball 55 also occurs due to the tail 53a being too short, bent or the like.

SUMMARY OF THE INVENTION

Therefore, it is an object of the present invention to provide an improved wire bonding apparatus.

It is another object of the present invention to provide an improved wire bonding method.

According to one aspect of the present invention, a wire bonding apparatus comprises a capillary tool through which a wire is inserted; a bonding arm holding the capillary tool; means for displacing the bonding arm upward or downward; a movable tale for moving the bonding arm horizontally; a torch for generating, by an electric spark, a ball at a lower end of the wire drawn out from a lower end of the capillary tool; a clamper for cutting the wire at a bonding point to a work by clamping and pulling upward the wire; and a suction section provided under an orbit path of the capillary tool for drawing out downward, by sucking, the wire from within the capillary tool.

According to another aspect of the present invention, a wire bonding method, wherein a torch is moved close to a lower end of a wire inserted through a capillary tool so as to form a ball at the lower end of the wire by generating an electric spark, then, the ball and the wire are, respectively, pressed onto a work so as to be bonded thereto by means of a lower end surface of the capillary tool by displacing downward the capillary tool, then, by clamping the wire by a clamper and raising the wire via the clamper, the wire is cut at a bonding point to the work so as to achieve bonding of the wire, comprises the steps of detecting presence or absence of a tail of the wire drawn out downward from a lower end of the capillary tool upon forming the ball using the torch; performing the bonding of the wire in case of presence of the tail, while, in case of absence of the tail, driving a movable table to move the capillary tool to a position above the suction section, sucking the lower end of the capillary tool using the suction section so as to draw out the tail from the lower end of the capillary tool; and restarting the bonding of the wire.

BRIEF DESCRIPTION OF THE DRAWINGS

The present invention will be understood more fully from the detailed description given hereinbelow, taken in conjunction with the accompanying drawings.

In the drawings:

FIGS. 4 to 8 are diagrams, respectively, for explaining operations of the suction section of the wire bonding apparatus shown in FIG. 1;

FIG. 10 is a partial sectional view of a capillary tool with no tail drawn out, which is caused in the conventional wire bonding apparatus.

DESCRIPTION OF THE PREFERRED EMBODIMENT

Now, a preferred embodiment of the present invention will be described hereinbelow with reference to the accompanying drawings.

Figure 1:
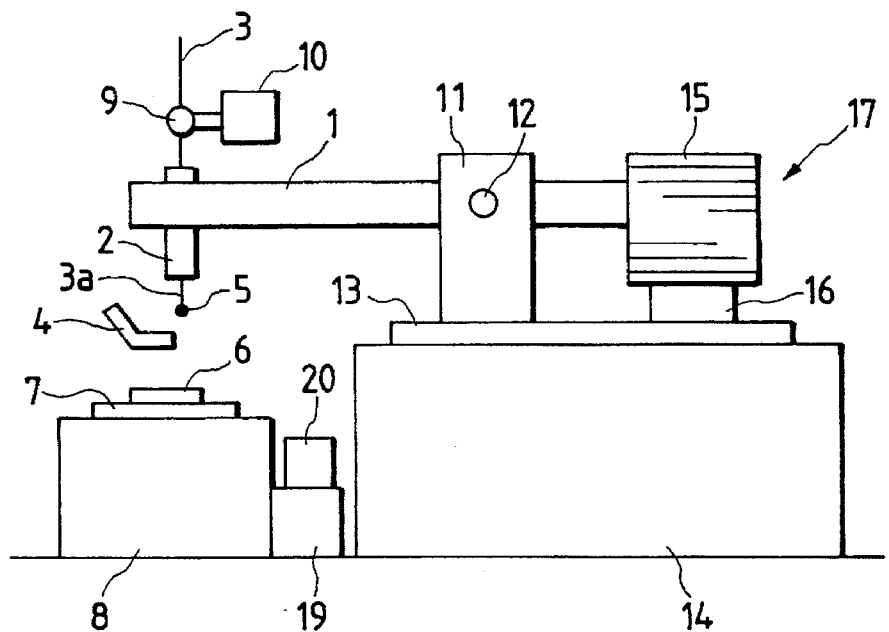
FIG. 1 is a side view showing a wire bonding apparatus according to a preferred embodiment of the present invention.
Figure 2:
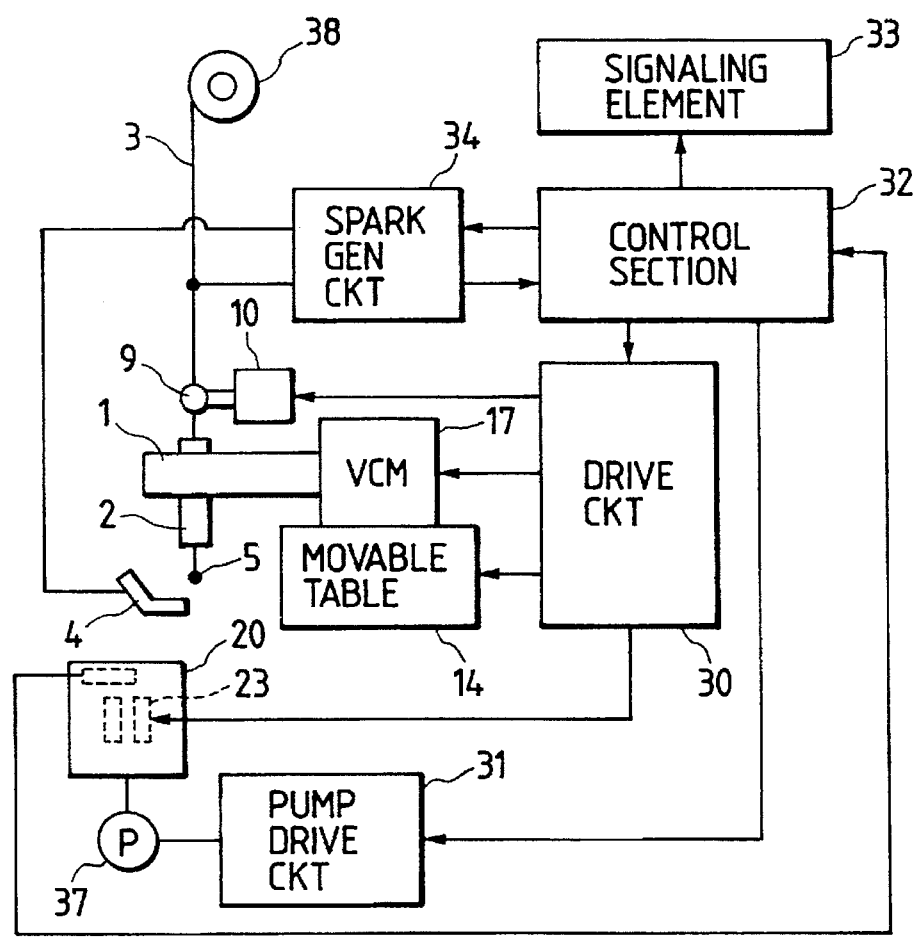
FIG. 2 is a block diagram of the wire bonding apparatus shown in FIG. 1.
Figure 3:
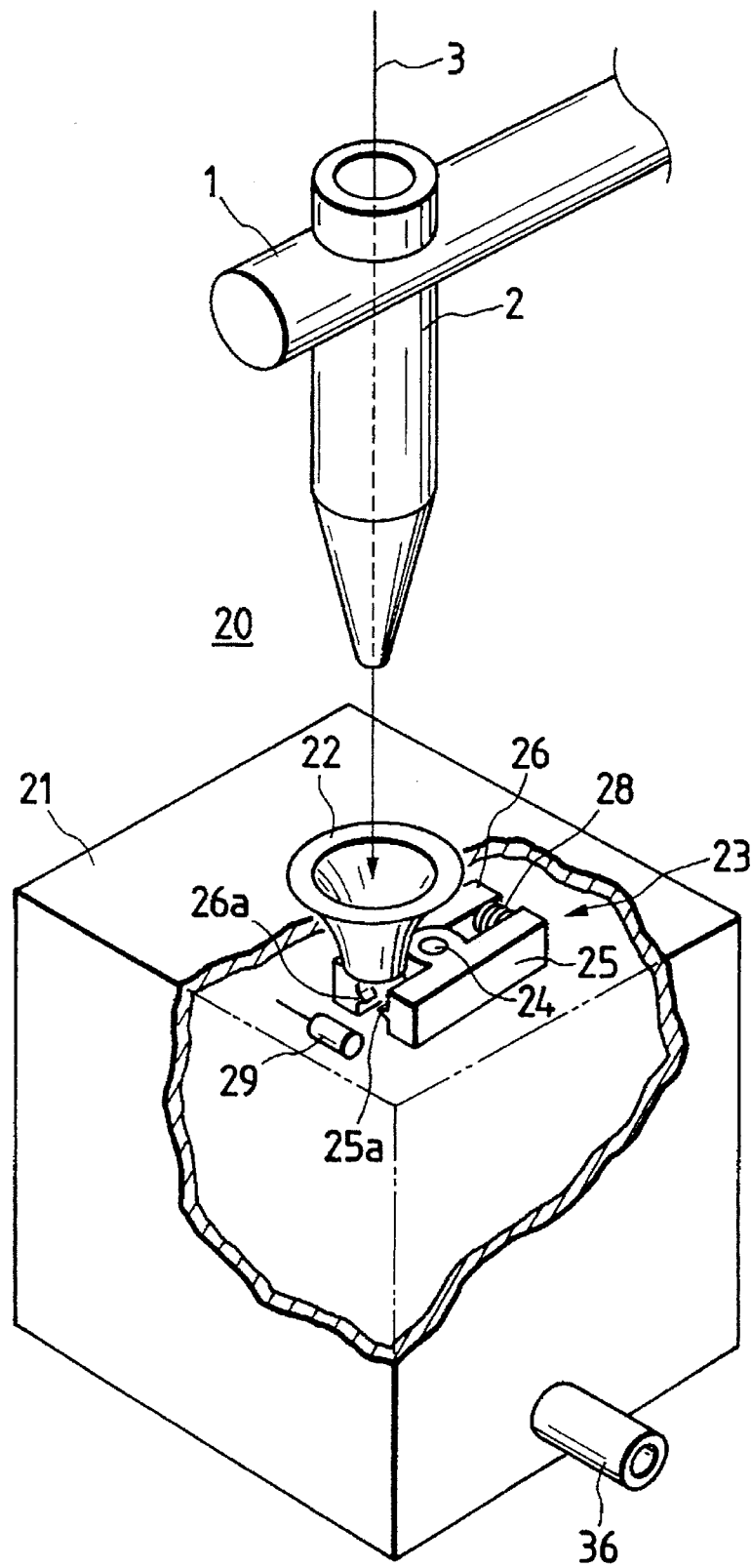
FIG. 3 a perspective view showing a suction section of the wire bonding apparatus shown in FIG. 1.

FIG. 1 is a side view showing a wire bonding apparatus according to a preferred embodiment of the present invention, FIG. 2 is a block diagram of the wire bonding apparatus, FIG. 3 is a perspective view showing a suction section of the wire bonding apparatus, and FIGS. 4 to 8 are diagrams, respectively, for explaining operations of the suction section of the wire bonding apparatus.

In FIG. 1, numeral 1 denotes a bonding arm, numeral 2 a capillary tool held at a tip portion of the bonding arm 1, numeral 3 a wire inserted through the capillary tool 2, and numeral 4 a torch. Above the capillary tool 2 is provided a clamper 9 for clamping or holding the wire 3. Numeral 10 denotes a drive section of the clamper 9.

The bonding arm 1 is mounted onto a pin 12 of a bearing section 11 so as to be pivotal or swingable upward and downward about the pin 12. Numeral 13 denotes a base plate provided on a movable table 14 and supporting the bearing section 11 thereon. A coil 15 is provided at a back end of the bonding arm 1, and a core 16 received in the coil 15 is provided on the base plate 13. The coil 15 and the core 16 constitute a voice coil motor (VCM) 17. When the coil 15 is energized, a magnetic force is generated. The bonding arm 1 makes upward or downward pivotal motion about the pin 12 due to this magnetic force. Further, when the movable table 14 is driven, the bonding arm 1 along with the capillary tool 2 move horizontally in an X direction or in a Y direction orthogonal to the X direction. The clamper 9 is coupled with the bonding arm 1 by a frame (not shown) and thus moves along with the bonding arm 1 and the capillary tool 2 in the X or Y direction. A substrate 7 is supported on a support section 8.

On the substrate 7 is mounted a chip 6. A pedestal 19 is arranged under an orbit path of the capillary tool 2. On the pedestal 19, a suction section 20 is mounted. The suction section 20 will be described later in detail;

In FIG. 2, numeral 30 denotes a drive circuit which drives the drive section 10 of the clamper 9, the movable table 14, the VCM 17, a cutter 23 and the like. Numeral 32 denotes a control section which controls the drive circuit 30, a pump drive circuit 31, a signaling element 33, a spark generation circuit 34 and the like. The control section 32 is inputted with a detection signal from a later-described wire detection sensor 29 provided at the suction section 20. The spark generation circuit 34 is connected between the torch 4 and the wire 3 and applies a high voltage between the torch 4 and the wire 3 to generate an electric spark between the torch 4 and a tail 3a of the wire 3 so as to form a ball 5 at a lower end of the tail 3a. When the electric spark is not achieved so as to fail in formation of the ball 5, the spark generation circuit 34 inputs a corresponding signal to the control section 32. Numeral 38 denotes a spool around which the wire 3 is wound.

Now, the suction section 20 will be described hereinbelow. FIG. 3 is a perspective view showing the suction section 20. Numeral 21 denotes a suction body of the suction section 20. At the center of an upper surface of the suction body 21, a trumpet-shaped nozzle 22 tapered downward is provided for establishing communication between interior space of the suction body 21 and the exterior. Numeral 23 denotes a cutter arranged just under the nozzle 22 and including a pair of pawls 25, 26 which rotate about a pin 24. The pawls 25, 26 have blades 25a, 26a on their inner surfaces at the tips, respectively. Numeral 28 denotes a coil. When the coil 28 is energized, the pawls 25, 26 rotate about the pin 24 so as to cut the wire 3 drawn out from the lower end of the capillary tool 2 with their blades 25a, 26a. Numeral 29 denotes the foregoing wire detection sensor provided under the cutter 23. To a lower portion of the suction body 21 is connected a pipe 36 which is then connected to a pump 37 (see FIG. 2). Accordingly, when the pump 37 is driven, air within the suction body 21 is sucked out via the pipe 36.

Now, operations of the wire bonding apparatus having the foregoing structure will be described hereinbelow.

Figure 9A:
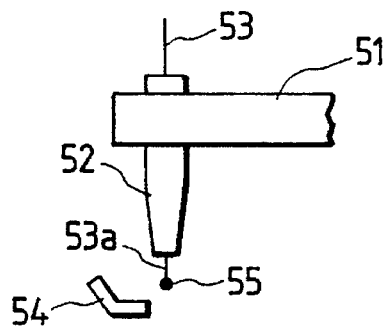
FIG. 9A is a side view showing a main portion of a conventional wire bonding apparatus in operation.
Figure 9B:
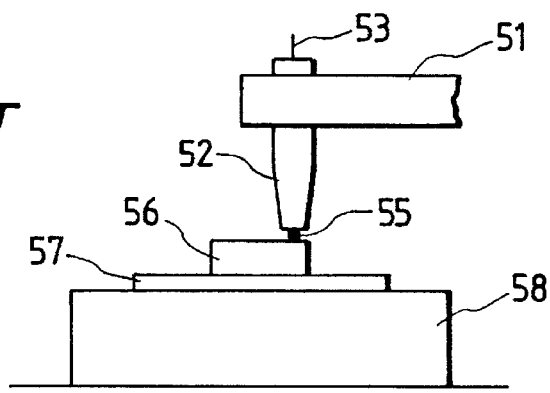
FIG. 9B is a side view showing a main portion of the conventional are bonding apparatus in operation.

In FIG. 1, the torch 4 is moved close to the lower end of the tail 3a drawn out from the lower end of the capillary tool 2. Subsequently, the spark generation circuit 34 (see FIG. 2) is driven to apply a high voltage to the torch 4. Then, the electric spark is generated between the torch 4 and the lower end of the tail 3a so that the ball 5 is formed. Thereafter, as in FIG. 9B, the movable table 14 is driven to move the capillary tool 2 to a position just above an electrode (not shown) of the chip 6, and then the coil 15 of the VCM 17 is energized to pivot the bonding arm 1 downward so that the ball 5 is pressed onto the electrode of the chip 6 by the lower end surface of the capillary tool 2 to be bonded thereto.

Figure 9C:
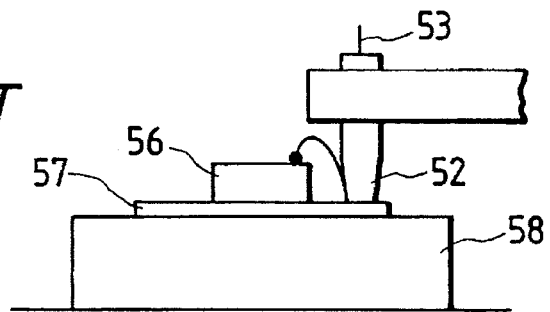
FIG. 9C is a side view showing a main portion of the conventional are bonding apparatus in operation.
Figure 9D:
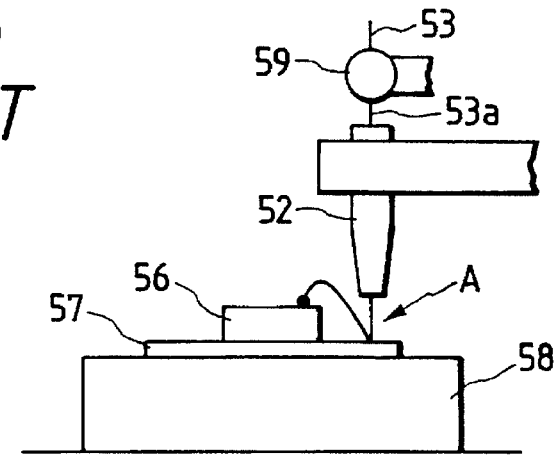
FIG. 9D is a side view showing a main portion of the conventional wire bonding apparatus in operation.

Subsequently, the capillary tool 2 is raised, and then the movable table 14 is driven to move the capillary tool 2 to a position just above an electrode (not shown) of the substrate 7. Thereafter, the coil 15 of the VCM 17 is energized to pivot the bonding arm 1 downward so that, as in FIG. 9C, the wire 3 is pressed onto the electrode of the substrate 7 by the lower end surface of the capillary tool 2 so as to be bonded thereto. Subsequently, as in FIG. 9D, the capillary tool 2 is raised, and the wire 3 is clamped or held by the clamper 9 and then pulled upward so that the wire 3 is cut at the bonding point to the substrate 7. A given sequence of the operations is then finished. By repeating the foregoing operations, the electrodes of the chips 6 and the substrates 7 are connected by the wire in succession.

As described before with reference to FIG. 10, the lower end of the wire 3 accidentally gets into the capillary tool 2. On this occasion, even by moving the torch 4 close to the lower side of the capillary tool 2, the electric spark is not generated so that the ball 5 is not formed at the lower end of the tail 3a.

Now, operations of drawing out the tail 3a from within the capillary tool 2 will be described with reference to FIGS. 3 to 8.

In FIG. 2, when the electric spark is not generated even by applying the high voltage to the torch 4, the corresponding signal is inputted from the spark generation circuit 34 to the control section 32. In response to this signal, the control section 32 executes the following control: Specifically, as shown in FIG. 3, the movable table 14 is driven to move the capillary tool 2 to a position just above the nozzle 22. Subsequently, as shown in FIG. 4, the VCM 17 is driven to pivot downward the bonding arm 1 so as to insert the lower end portion of the capillary tool 2 into the nozzle 22. In this case, for achieving the tail 3a of a given length (t), the capillary tool 2 is lowered to a position where a distance between the lower end surface of the capillary tool 2 and the blades 25a, 26a is equal to the length (t). Thereafter, as shown in FIG. 5, the pump 37 is driven so as to suck out air from within the suction body 21. Then, due to a suction force, the wire 3 entering the inside of the capillary tool 2 is drawn out from the lower end of the capillary tool 2.

Figure 7:
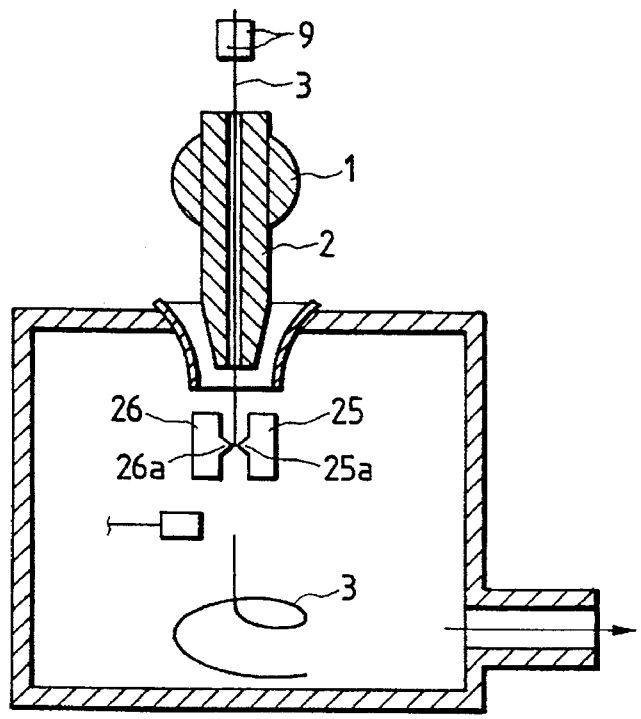
Figure 8:
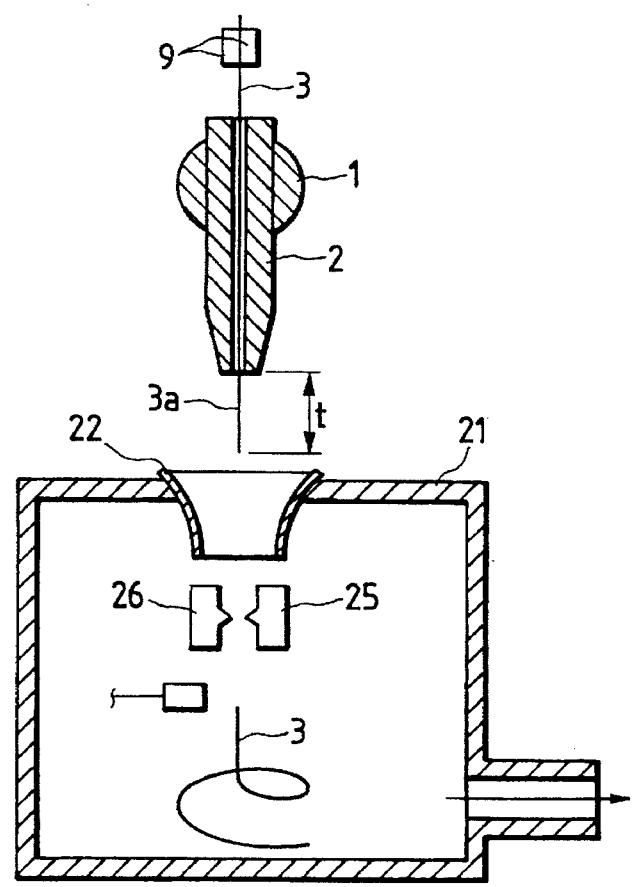

When the wire detection sensor 29 detects the drawing-out of the wire 3, the wire 3 is clamped by the clamper 9 as shown in FIG. 6 so as to prevent further suction of the wire 3 into the suction body 21. Subsequently, as shown in FIG. 7, the cutter 23 is driven to cut the wire 3 by the blades 25a, 26a. Then, as shown in FIG. 8, the VCM 17 is energized to pivot the bonding arm 1 upward so that the capillary tool 2 gets out of the nozzle 22. At this time, the clamper 9 is raised, holding the wire 3, along with the capillary tool 2. Accordingly, the tail 3a of the given length (t) is held drawn out from the lower end of the capillary tool 2. A cut-off portion of the wire 3 is arranged to fall within the suction body 21. When the wire drawing-out operation is finished as described above, the movable table 14 is driven to return the capillary tool 2 to the initial or home position as shown in FIG. 1, and then the foregoing wire bonding operations are restarted.

As described above, according to the foregoing preferred embodiment, when the wire 3 gets into the capillary tool 2, the suction section 20 automatically sucks out the wire 3 from within the capillary tool 2. This significantly reduces the operator's labor. Further, since the tail 3a can be drawn out quickly, the operation stopping time for drawing out the tail can be largely shortened so that the wire bonding operation efficiency can be highly improved. Further, by cutting the wire using the cutter, the tail of a constant length is constantly achieved so that the formation of the ball using the electric spark can be stably performed.

While the present invention has been described in terms of the preferred embodiment, the invention is not to be limited thereto, but can be embodied in various ways without departing from the principle of the invention as defined in the appended claims.

For example, in the foregoing preferred embodiment, the bonding arm 1 is described to make upward or downward pivotal motion about the pin 12. However, it may be arranged that the bonding arm 1 makes non-pivotal upward or downward motion.

What is claimed is:

1. A wire bonding apparatus comprising:

a capillary tool through which a wire is inserted;

a bonding arm holding said capillary tool;

means for displacing said bonding arm upward or downward;

a movable table for moving said bonding arm horizontally;

a torch for generating, by an electric spark, a ball at a lower end of said wire drawn out from a lower end of said capillary tool;

a clamper for cutting said wire at a bonding point to a work by clamping and pulling upward said wire; and a suction section provided under an orbit path of said capillary tool for drawing out downward, by sucking, the wire from within said capillary tool.

2. The wire bonding apparatus according to claim 1, wherein said suction section includes a cutter for cutting the wire drawn out from the lower end of said capillary tool with a tail of a given length remaining.

3. The wire bonding apparatus according to claim 1, wherein said suction section includes a suction body having space therein, a nozzle mounted on an upper portion of said suction body for receiving the lower end of said capillary tool, a cutter provided under said nozzle for cutting the wire sucked into said space, and wire detection means for detecting suction of the wire into said space.

4. The wire bonding apparatus according to claim 3, wherein, when said wire detection means detects the wire, said clamper holds the wire so as to prevent further suction of the wire into said space.

5. A wire bonding method, wherein a torch is moved close to a lower end of a wire inserted through a capillary tool so as to form a ball at the lower end of the wire by generating an electric spark, then, said ball and said wire are, respectively, pressed onto a work so as to be bonded thereto by means of a lower end surface of said capillary tool by displacing downward said capillary tool, then, by clamping said wire by a clamper and raising said wire via said clamper, the wire is cut at a bonding point to the work so as to achieve bonding of the wire, said method comprising the steps of:

detecting presence or absence of a tail of the wire drawn out downward from a lower end of said capillary tool upon forming the ball using said torch;

performing said bonding of the wire in case of presence of said tail, while, in case of absence of said tail, driving a movable table to move said capillary tool to a position above a suction section, sucking the lower end of said capillary tool using said suction section so as to draw out the tail from the lower end of said capillary tool; and restarting said bonding of the wire.

6. The wire bonding method according to claim 5, wherein presence or absence of said tail is detected based on said electric spark.

7. The wire bonding method according to claim 5, wherein said suction section includes a suction body having space therein, a nozzle mounted on an upper portion of said suction body for receiving the lower end of said capillary tool, a cutter provided under said nozzle for cutting the wire sucked into said space, and wire detection means for detecting the wire sucked into said space, and wherein, when said wire detection means detects the wire sucked into said space, said clamper clamps the wire, and said cutter is operated to cut the wire with the tail of a given length remaining.

* * * * *